(12) United States Patent
Thonnart et al.

(10) Patent No.: US 9,000,840 B2
(45) Date of Patent: Apr. 7, 2015

(54) INTEGRATED CIRCUIT COMPRISING A CLOCK TREE CELL

(71) Applicants: Commissariat à l'énergie atomique et aux énergies alternatives, Pairs (FR); STMicroelectronics SA, Montrouge (FR); STMicroelectronics (Crolles 2) SAS, Crolles (FR)

(72) Inventors: Yvain Thonnart, Grenoble (FR); Bastien Giraud, Grenoble (FR); Fady Abouzeid, Grenoble (FR); Sylvain Clerc, Grenoble (FR); Jean-Philippe Noel, Montbonnot Saint Martin (FR)

(73) Assignees: Commissariat à l'énergie atomique et aux énergies alternatives, Paris (FR); STMicroeletronics SA, Mountrouge (FR); STMicroeletronics (Crolles 2) SAS, Crolles (FR)

( * ) Notice: Subject to any disclaimer, the term of this patent is extended or adjusted under 35 U.S.C. 154(b) by 0 days.

(21) Appl. No.: 14/134,167

(22) Filed: Dec. 19, 2013

(65) Prior Publication Data

US 2014/0176216 A1    Jun. 26, 2014

(30) Foreign Application Priority Data

Dec. 26, 2012 (FR) ...................... 12 62812

(51) Int. Cl.
| | | |
|---|---|---|
| H01L 25/00 | (2006.01) | |
| H03K 3/012 | (2006.01) | |
| G05F 3/02 | (2006.01) | |
| H01L 27/12 | (2006.01) | |
| H01L 21/84 | (2006.01) | |
| H01L 27/02 | (2006.01) | |
| H01L 27/118 | (2006.01) | |
| H01L 29/786 | (2006.01) | |

(52) U.S. Cl.
CPC ........ *H03K 3/012* (2013.01); *G05F 3/02* (2013.01); *H01L 27/1203* (2013.01); *H01L 21/84* (2013.01); *H01L 27/0207* (2013.01); *H01L 27/11807* (2013.01); *H01L 29/78648* (2013.01)

(58) Field of Classification Search
CPC .............................. H01L 2924/00; G06F 1/04
USPC .......... 327/291, 293, 295, 297, 564, 565, 566
See application file for complete search history.

(56) References Cited

U.S. PATENT DOCUMENTS

| | | | | |
|---|---|---|---|---|
| 8,631,377 B2 * | 1/2014 | Lee et al. | ...................... | 716/124 |
| 2006/0027877 A1 | 2/2006 | Inaba | | |

FOREIGN PATENT DOCUMENTS

WO    WO2012/160071    11/2012

OTHER PUBLICATIONS

Noel et al. "UT2B-FDSOI Device Architecture Dedicated to Low Power Design Techniques"; IEEE 210-213 (2010).

(Continued)

*Primary Examiner* — Jeffrey Zweizig
(74) *Attorney, Agent, or Firm* — Occhiuti & Rohlicek LLP (57) ABSTRACT

An integrated with a block including first and second oppositely doped semiconductor wells. There are standard cells placed next to one another, each standard cell including first transistors and a clock tree cell encircled by standard cells. The clock tree cell has a third semiconductor well with the same doping type as the doping of the first well and second transistors. The clock tree cell also has a semiconductor strip extending continuously around the third well and having the opposite doping type to the doping of the third well to electrically isolate the third well from the first well.

12 Claims, 4 Drawing Sheets

(56) References Cited

OTHER PUBLICATIONS

Noel et al. "Multi-$V_t$ UTBB FDSOI Device Architectures for Low-Power CMOS Circuit"; IEE Transactions on Electronic Devices; 58(8):2473-2482 (2011).

Pavlidis et al. "Clock Distribution Networks for 3-D Integrated Circuits"; IEEE 2008 Custom Integrated Circuits Conference (CICC); 651-654 (2008).

* cited by examiner

INTEGRATED CIRCUIT COMPRISING A CLOCK TREE CELL

RELATED APPLICATIONS

Under 35 USC 119, this application claims the benefit of the priority date of French Patent Application 1262812, filed Dec. 26, 2012, the content of which is herein incorporated by reference.

FIELD OF DISCLOSURE

The invention relates to an integrated circuit. The invention also relates to a method of using this integrated circuit.

The invention is in particular applicable to integrated circuits produced on a silicon-on-insulator (SOI) substrate. SOI technology consists in separating a thin silicon layer (a few nanometers in thickness) from a silicon substrate, using a relatively thick insulating layer (a few tens of nanometers in thickness as a general rule).

BACKGROUND

Integrated circuits produced by SOI technology exhibit a certain number of advantages. Such circuits generally have a lower power consumption for an equivalent performance, or a better performance for a given consumption. Such circuits also induce lower parasitic capacitances, which make it possible to improve switching speed. In addition, latch up, which is encountered in bulk technology metal-oxide-semiconductor (MOS) transistors, may be prevented. Such circuits therefore prove to be particularly suitable for system on chip (SoC) or microelectromechanical system (MEMS) applications. It is also noted that SOI integrated circuits are less sensitive to the effects of ionizing radiations and thus turn out to be more reliable in applications where such radiations may induce operational problems, in particular in space applications. SOI integrated circuits may notably comprise active static random access memory (SRAM) or logic gates.

SUMMARY

The reduction in the static consumption of logic gates while increasing their toggling speed forms the subject of much research. Certain integrated circuits currently being developed integrate at one and the same time logic gates with low consumption and logic gates with high toggling speed. To generate these two types of logic gates in a given integrated circuit, the threshold voltage (abbreviated $V_T$) of certain transistors is decreased to form fast-access logic gates, and the threshold voltage of other transistors is increased to form low-consumption logic gates. In bulk technology, modulation of the threshold voltage level of transistors of the same type is mainly achieved by modifying their channel doping level. However, in FDSOI (fully depleted silicon-on-insulator) technology channel doping is almost inexistent ($10^{15}$ cm$^{-3}$). Thus, the doping level of the channel of the transistors therefore cannot exhibit any significant variations, thus preventing the threshold voltages from being differentiated in this way. One solution proposed in certain studies, in order to produce transistors of the same type with different threshold voltages, is to use different gate materials in these transistors. However, the practical production of an integrated circuit such as this turns out to be technically tricky and economically prohibitive.

In order for different transistors produced in FDSOI technology to have different threshold voltages it is also known to use an electrically biased ground plane (or back plane) placed between a thin insulating oxide layer and the silicon substrate. By adjusting the doping type of the ground planes and their electrical bias, it is possible to improve electrostatic control of these transistors, thereby allowing different threshold-voltage ranges to be defined for these transistors. It is thus possible to produce transistors with a low threshold voltage, termed LVT (for low $V_T$) transistors, transistors with a high threshold voltage, termed HVT (for high $V_T$) transistors, and transistors with an intermediate threshold voltage, termed SVT (for standard $V_T$) or RVT (for regular $V_T$) transistors. Typically, the threshold voltage of LVT transistors is 350 mV or less, that of HVT transistors 500 mV or more, and that of RVT transistors comprised between 350 mV and 500 mV.

Such transistors are for example described in the technical application note by P. Flatresse et al., "Planar fully depleted silicon technology to design competitive SOC at 28 nm and beyond", STMicroelectronics, 2012, available on the website "www.soiconsortium.org".

The state-of-the-art is also described in the following documents:

WO 2012/160071 A1 (CEA);
Jean-Philippe Noel et al. "Multi-VT UTBB FDSOI device architectures for low-power CMOS circuit"; IEEE Transactions on Electron Devices, vol. 58, p. 2473-2482, August 2011; and
US 2006/027877 A1 (INABA).

As is known, synchronous logic integrated circuits require a clock signal to synchronize operation of the logic elements of the circuit. Typically, this clock signal is distributed from a clock signal generator to elements of the circuit, such as registers or switches, by way of a clock tree. This clock tree is a network of electrical interconnects that typically has a tree-like structure, comprising a common trunk, connected to the clock signal generator, dividing into a multitude of branches. Each of these branches may itself divide into a plurality of additional branches.

To ensure correct operation of the circuit, and especially to prevent setup and hold time violations, this clock tree must be carefully configured to limit the appearance of differences in the propagation time of the clock signal (clock skew). For this purpose, the clock tree typically comprises clock tree cells that implement functions optimizing the distribution of the clock signal, such as buffer functions. Thus, each clock tree cell is connected to a branch of the clock tree, and receives an input clock signal from this clock tree. This clock tree cell is also adapted to deliver an output clock signal, able to be distributed to the logic elements of the circuit. In the case where the clock tree cell acts as a buffer, the output clock signal is identical to the input clock signal except that it is delayed by a preset amount of time. These buffers may be adapted, during design of the integrated circuit, to balance the branches of the clock tree and control the appearance of clock skew.

However, integrating such clock tree cells into a circuit comprising standard cells in FDSOI technology with different threshold voltages causes a number of problems.

Typically, the circuit also comprises standard cells, containing transistors connected to form the logic elements of the circuit. In this description, the term "standard cell" is understood to mean an integrated-circuit portion corresponding to the physical implementation of a cell of a library of an integrated-circuit design program. Therefore, the standard cells are not necessarily all identical to one another. In contrast, these standard cells do not belong to the clock tree.

In 28 nm FDSOI technology, these standard cells are typically arranged in the circuit in the form of blocks. Standard cells belonging to a given block all have the same threshold-voltage range. When a number of blocks are implanted on a given substrate, each block comprises its own deep buried well, above which each of the standard cells of this block are produced in order to isolate them electrically from the substrate. If such a deep buried well does not exist, all the standard cells produced on the substrate are considered to belong to the same block. Each block has a regular shape and contains a number of contiguous standard cells. Here, cells are said to be "contiguous" if they are separated from one another only by a trench isolation, typically a deep trench isolation. Here, each block has a substantially rectangular shape. Two separate blocks, and in particular their respective deep buried wells, are spaced apart from each other by a strip-shaped separating zone. This strip is, for example, larger than or equal to a few microns in width. Preferably, no transistors are implanted in this separating zone.

Clock tree cells located at the ends of the branches are electrically connected to the standard cells in order to transmit the output clock signal to them. These clock tree cells located at the ends of the branches are called leaves of the clock tree.

Commonly used clock tree cells are structurally similar to the standard cells of the circuit. Leaf cells of the clock tree are preferably integrated into each block as near as possible to the standard cells, especially in order to reduce the length of the electrical connections connecting these leaf cells to the neighbouring standard cells.

It would therefore be desirable to provide an integrated circuit comprising transistors in 28 nm FDSOI technology, this circuit comprising a clock tree cell that is able to be electrically controlled independently from the standard cells of the circuit, while minimizing the footprint required to integrate this clock tree cell into a block of standard cells, i.e. cells comprising transistors with a given threshold voltage.

However, in each block of the circuit, the clock tree cell must be sufficiently isolated from adjacent standard cells to prevent its operation from being affected by the electrical biases applied to the ground plane of the standard cells. With current 28 nm FDSOI technology design rules, such a clock tree cell is separated from standard cells by a spacing of several microns, thereby wasting as much as 10% of the footprint of the block. Such wasted space limits the number of logic elements that can be produced in the circuit, which is not economically acceptable.

Thus, the invention relates to an integrated circuit according to Claim 1.

Thus, the clock tree cell may be integrated into a block of standard cells, while keeping a small footprint as it comprises only a single semiconductor well. This well of the clock tree cell is electrically isolated from those wells of adjacent standard cells which have the same doping type, by surrounding it with an oppositely doped semiconductor strip. This strip makes contact with this well of the clock tree cell so as to form a reverse biased p-n junction, thereby ensuring electrical isolation of these cells from one another. This specific configuration makes it possible to circumvent design rules that required a large spacing between these cells, and thus allows the footprint occupied by the clock tree cell to be decreased.

Embodiments of the invention may comprise one or more of the features of Claims 2 to 12.

These embodiments furthermore have the following advantages:

the deep buried well allows the substrate to be electrically isolated from the first and third wells, thereby limiting the risk of a leakage current appearing between these wells and the substrate; and that portion of the clock tree cell which is located above the semiconductor strip may be used to locate antenna diodes or decoupling capacitors that, otherwise, would have to be located in other positions in the circuit, thereby allowing the footprint occupied by the block of standard cells to be decreased.

The invention also relates to a method for using an integrated circuit according to Claim 12.

BRIEF DESCRIPTION OF THE DRAWINGS

The invention will be better understood on reading the following description, given merely by way of non-limiting example and with reference to the drawings in which.

DETAILED DESCRIPTION

In these figures, the same references are used to denote the same elements.

In the rest of the description, features and functions that are well known in the art will not be described in detail.

Figure 1:
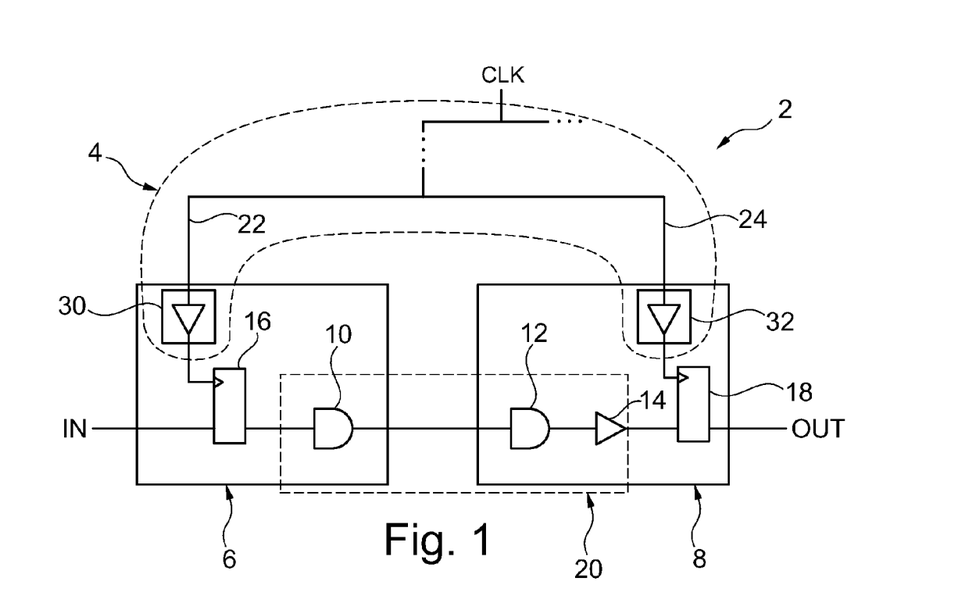
FIG. 1 is a schematic illustration of a portion of an integrated circuit comprising a clock tree.

FIG. 1 shows, in a simplified way, a portion of an integrated circuit 2 containing a clock tree 4. In this example, the circuit 2 comprises blocks 6 and 8 that contain a plurality of logic elements (such as logic gates) and synchronous elements (such as switches) formed from transistors contained in standard cells placed in these blocks 6 and 8. Within each block 6 and 8 the transistors of these standard cells have the same threshold-voltage range, for example low (LVT), standard (RVT) or high (HVT). For example, the transistors of the block 6 have a separate threshold-voltage range from that of the transistors of the block 8. In this case, the respective transistors of these blocks 6 and 8 are able, in operation, to be electrically biased by different voltages. For the sake of simplicity, only three logic elements 10, 12 and 14 are shown. Likewise, only two synchronous elements 16 and 18 are shown. The elements 10, 12 and 14 are connected together in order to form an assembly 20 configured to perform a preset logic function. This assembly 20 is configured to receive an input signal IN transmitted from the block 6, and to deliver an output signal OUT in response to the signal IN, generated in the block 8. The clock tree 4 is able to transmit a clock signal CLK to the elements 16 and 18 of the circuit 2, such that this signal CLK is received simultaneously by these elements 16 and 18, in order to synchronize the operation of the assembly 20 with that of the rest of the circuit 2. In this example, the signal CLK transmitted by the element 16 is a periodic square wave signal.

This clock tree 4 is a network of electrical interconnects here taking a tree-like form comprising a plurality of branches. For the sake of simplicity, only two branches 22 and 24 of this tree 4 are shown. In this example, the branch 22 is connected to a clock input of the element 16, and the branch 24 is connected to a clock input of the element 18. In order to limit differences in the propagation time of the signal CLK in the branches 22 and 24, the tree 4 comprises a plurality of clock tree cells. Each of these clock cells is here configured to delay the propagation of the signal CLK by a preset delay time. Thus, selectively adding clock tree cells in the branches of the tree 4 allows these differences in propagation time to be decreased. In this example, only two clock tree cells 30, 32 are shown. For example, these cells 30 and 32 are leaves of the tree 4. These cells 30 and 32 are here inserted into each of the blocks 6 and 8, respectively. Here, these cells 30 and 32 are similar, with the exception that the cell 30 is located inside the block 6 and the cell 32 is located inside the block 8.

In this description, two similar cells may have geometric differences, for example made necessary by the circuit design steps, in order to adapt these cells for electrical connection with other cells of the circuit, contiguous with these cells.

Figure 2:
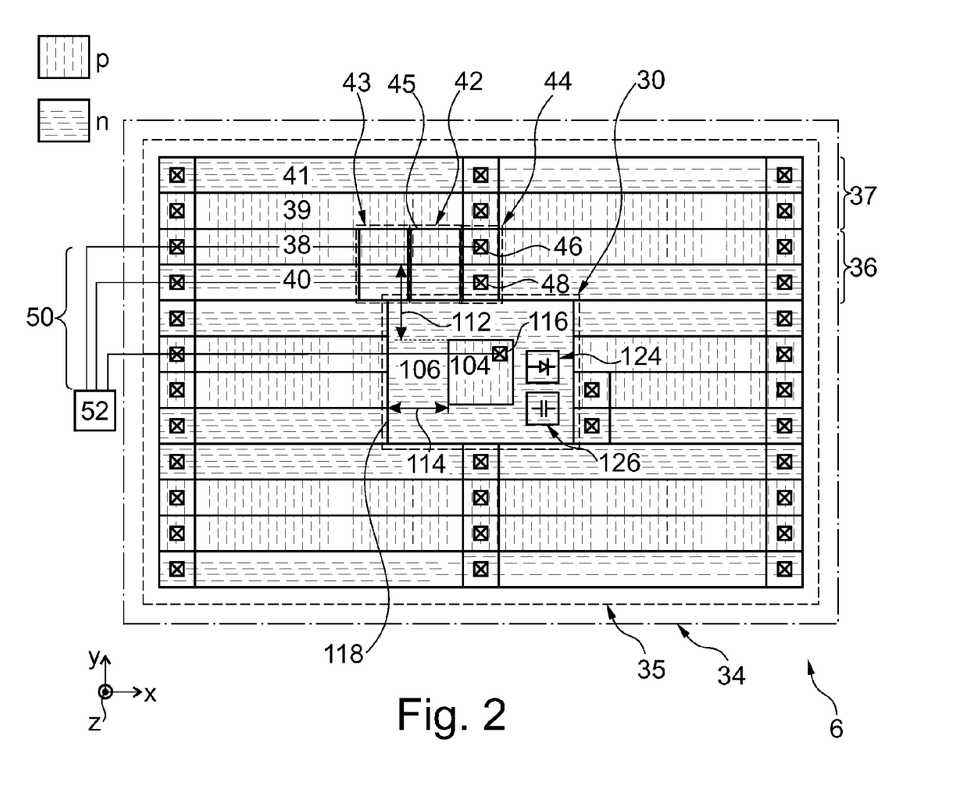
FIG. 2 is a schematic illustration of a longitudinal cross section through a block of the integrated circuit in FIG. 1.

FIG. 2 shows the block 6 of the integrated circuit 2 in greater detail. This circuit 2 comprises:
 a semiconductor substrate 34;
 a plurality of rows of standard cells; and
 the clock tree cell 30.

The substrate 34 lies essentially in a plane called the "substrate plane". Here, the substrate plane is parallel to orthogonal horizontal directions X and Y and perpendicular to a vertical direction Z. This substrate plane forms a lower portion of the circuit 2. Here this substrate 34 is p-doped with a doping concentration lower than or equal to $1 \times 10^{16}$ cm$^{-3}$ or $3 \times 10^{15}$ cm$^{-3}$. To simplify FIG. 2 the substrate 34 is represented by a dotted line. Here, this substrate 34 is electrically connected to an electrical ground potential GND of the circuit 2.

Advantageously, the circuit 2 furthermore comprises a deep buried well 35. This well 35 extends continuously and parallel to the substrate plane 34. This well 35 is located immediately on the substrate 34. This well 35 allows the appearance of leakage currents towards the substrate 34 to be limited. For this purpose, the doping type of the well 35 is especially chosen to form a reverse biased p-n junction with the substrate 34. Here, the well 35 is n-doped. In order to simplify FIG. 2, the well 35 is represented by a dotted line.

Here the rows have a substantially rectilinear shape and all extend, within the block 6, in the X-direction. These rows have the same width, measured in the Y-direction. These rows are placed parallel to one another and are contiguous, pairwise, along one of their edges parallel to the X-direction.

For the sake of simplicity only the rows 36 and 37 are described. The rows 36 and 37 are arranged, in block 6, parallel to each other and contiguous to each other.

The row 36 comprises:
 first 38 and second 40 semiconductor wells, having opposite doping types;
 a plurality of standard cells; and
 at least one cell for biasing the wells 38 and 40.

In this example, the well 38 is p-doped. The well 40 is n-doped. The wells 38 and 40 have a doping concentration comprised between $10^{16}$ and $10^{18}$ cm$^{-3}$.

The wells 38 and 40 are placed next to one another in a given plane, called the "well plane", parallel to the substrate plane. These wells 38 and 40 each lie in this well plane, parallel to the X-direction. Here, these wells 38 and 40 are located above the deep well 35. Thus, the risk of leakage currents appearing between the well 38 and the substrate 34 is reduced.

Standard cells are placed next to one another in the row 36, so that the wells 38 and 40 are common to all the cells of the row 36. Here, these standard cells have a substantially rectangular shape, with the same height as the rows. These standard cells are separated from one another by trench isolations 45. For the sake of simplicity, only two identical standard cells 42 and 43, immediately adjacent to each other, are shown in FIG. 2. On the edge where the cells 42 and 43 touch each other, the trench isolation 45 is common to these cells 42, 43.

Here, the row 36 comprises a plurality of cells for biasing the wells 38 and 40. These cells are regularly spaced in each row. For the sake of simplicity, only a bias cell 44 is described in detail. The cell 44 comprises two connectors 46, 48, electrically connected to the wells 38 and 40, respectively. These connectors 46 and 48 are each able to electrically bias the wells 38 and 40 when an electrical bias is applied to said connector by a voltage source. For this purpose, these connectors 46 and 48 make direct electrical contact with the wells 38 and 40, respectively. These connectors 46 and 48 each comprise, for example, a trench extending as far as the wells 38 and 40, respectively, and filled with an electrically conductive material such as a metal. Thus, the respective wells of each row may be biased with a given electrical potential.

In this description, two elements are said to make direct contact if they are in immediate physical contact with each other and if no other element of different nature is interposed between these two elements.

In this example, the rows of block 6 are placed in a flipped row configuration: the positions of the wells are permutated from one row to the other in the Y-direction, such that two contiguous wells, and respectively belonging to two contiguous rows, have the same doping. Here, the row 37 is identical to the row 36, except that the positions of the wells are permutated. In FIG. 2, the wells of this row 37 corresponding to the wells 38 and 40 bear the numerical references 39 and 41, respectively.

Advantageously, the circuit 2 comprises:
 an electrical power supply network 50; and
 an electrical power source 52.

The network 50 is able to apply separate electrical biases to the wells 38 and 40. To do this, here this network is electrically connected to the connectors 46 and 48. In this example, the network is configured so that all the wells 38 and 39, 40 and 41 of the rows of the block 6 having a given doping type are biased with the same electrical potential.

The source 52 is able to deliver electrical voltages to the network 50.

Figure 3:
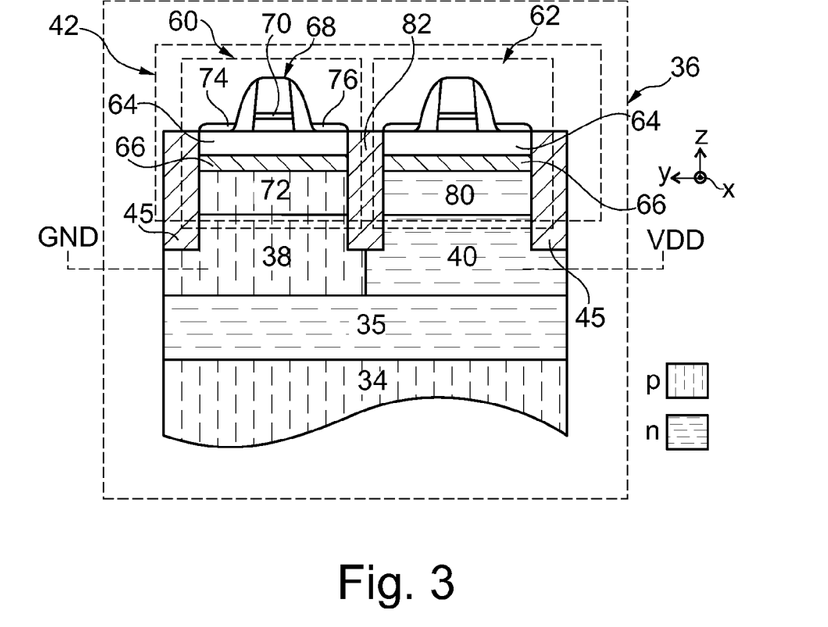
FIG. 3 is a schematic cross-sectional view of a row of the block in FIG. 2.

FIG. 3 shows, in greater detail, a cell 42 of the row 36. Typically, each cell here comprises two transistors, the drain of one of these transistors being electrically connected directly to the source of the other transistor of the same cell. In the rest of the description, to simplify the figures, this electrical connection between the two transistors of a given cell has not been shown. The cell 42 comprises metal-oxide-semiconductor (MOS) field-effect transistors 60, 62. These transistors 60 and 62 are produced in FDSOI technology. The transistors 60 and 62 are placed plumb with the wells 38 and 40, respectively.

Thus, the transistor 60 comprises:
 a semiconductor layer 64, called the active layer;
 a buried layer 66 of electrically insulating material, located under the layer 64;
 a gate multilayer 68, located on the layer 64 and especially comprising a gate 70; and
 a semiconductor ground plane 72, located under the layer 66.

The layer 64 forms a channel between a source 74 and a drain 76. As is known, in FDSOI technology this layer 64 is fully depleted and has a very low doping level, typically lower than or equal to $10^{15}$ cm$^{-3}$. This layer 64 is smaller than or equal to 50 nm in thickness.

In this description, thickness and depth are defined relative to the Z-direction. Depth is defined relative to a horizontal reference plane passing, for example, through the layer 66.

The layer 66 electrically isolates the layer 64 from the ground plane 72. This layer 66 extends substantially parallel to the substrate plane. The layer 66 is here an ultra-thin buried oxide layer (UTBOX) and is smaller than 40 nm in thickness, and preferably smaller than or equal to 25 nm in thickness. The expression "electrically insulating material" is here understood to mean a material the electrical resistivity of which, at a temperature of 20° C., is higher than or equal to $10^5$ Ω·m or to $10^6$ Ω·m. For example, here this layer 66 is made of silicon oxide (SiO$_2$).

The ground plane 72 allows the electrostatic properties of the transistor 60 to be controlled by applying an electrical potential to this ground plane 72. The ground plane 72 is located directly and only on the well 38, so that its electrical bias can be applied by way of the well 38. For this purpose, the ground plane 72 extends horizontally and is arranged immediately above the well 38, so as to be located plumb with the layer 64.

In this example, a ground plane of a transistor has the same doping type as the well above which this ground plane is placed. Here, the ground plane 72 thus has the same doping type as the doping of the well 38. The doping concentration of the ground plane 72 is here comprised between $10^{18}$ cm$^{-3}$ and $10^{20}$ cm$^{-3}$. Here, this ground plane 72 has a thickness comprised between 50 nm and 300 nm, and preferably between 70 nm and 200 nm. The ground plane 72 and the well 38 are here fabricated from one and the same semiconductor material, by separate ion implantation steps. Each of the ground plane 72 and the well 38 have a separate doping profile.

In this example, the transistor 60 is an nMOS transistor. Here, the source 74 and the drain 76 are formed above the layer 64. Here, this transistor has an intermediate threshold voltage, i.e. it is an RVT (regular V$_T$) transistor.

The transistor 62 is similar to the transistor 60, except that here:

the transistor 62 is a pMOS transistor; and
the ground plane 72 is replaced by a semiconductor ground plane 80 located only above, and plumb with, the well 40, and having the same doping type as the doping of the well 40.

For example, apart from the above differences, everything that was described with reference to the transistor 60 applies to the transistor 62.

The cell 42 comprises, in addition to the trench isolation 45, a trench isolation 82, in order to electrically isolate the transistors 60, 62 from each other. Here, isolation of the transistors 60 and 62 is especially understood to mean that the ground planes 72 and 80 are electrically isolated from each other. More specifically, the trench isolation 45 allows the transistors 60, 62 to be electrically isolated from standard cells adjacent to the cell 42. For this purpose, the trench isolation 45 encircles, in a horizontal plane, the cell 42 over its entire external perimeter. The trench isolation 82 allows the transistors 60 and 62 of a given cell 42 to be electrically isolated from each other. In this example, the trench isolation 82 is located between the transistors 60 and 62. These trench isolations 45 and 82 each extend, in the Z-direction, from an upper side of the layer 64 as far as a lower end located in the well plane and here having one and the same depth. This end is here located in the wells 38 and 40, at a depth greater than the depth of the ground planes 72 and 80. These trench isolations 45 and 82 are made of an electrically insulating material. For example, these trench isolations 45 and 82 are made of silicon oxide.

The cell 30 (FIG. 2) is able to receive an input clock signal, and to transmit an output clock signal to a cell 42 of the block 6. Here, the input clock signal is the clock signal CLK. This cell 30 is surrounded by rows, so as to be contiguous with standard cells. Here, this cell 30 is located in the extension of two rows of the block 6. This cell 30 is here contiguous with the cells 42 and 43 of the row 36.

Figure 4:
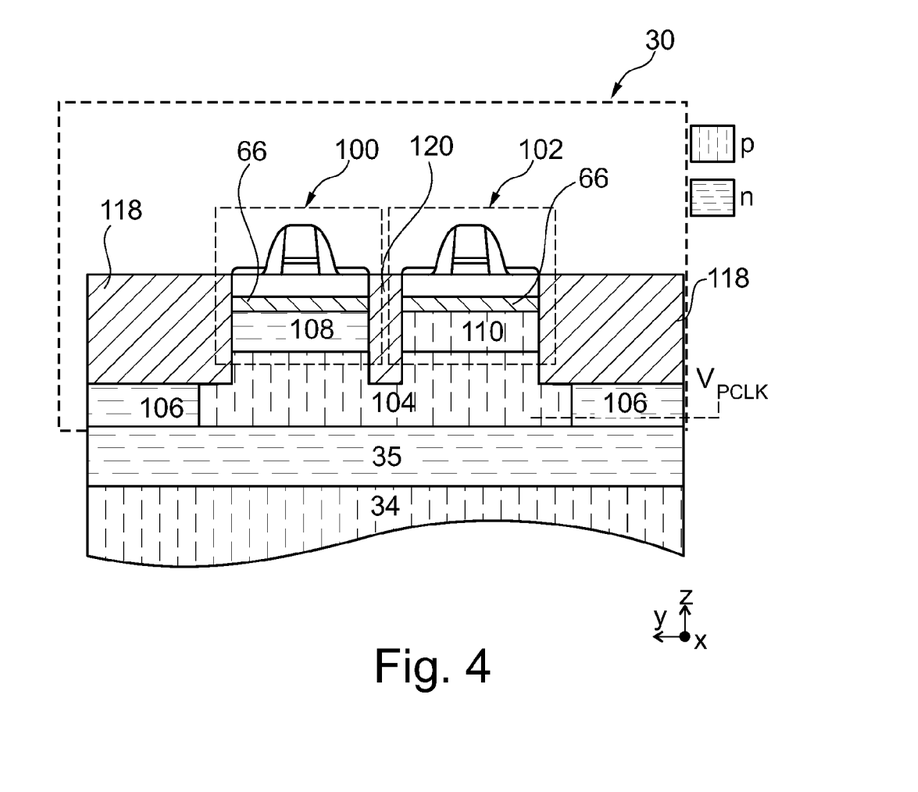
FIG. 4 is a schematic cross-sectional view of a clock tree cell of the block in FIG. 2.

FIG. 4 shows the cell 30 in greater detail. This cell 30 comprises:

transistors 100, 102;
a single semiconductor well 104 common to all the transistors of the cell 30; and
a semiconductor strip 106 encircling, in a horizontal plane, the well 104.

The transistors 100 and 102 are placed plumb with the well 104. These transistors 100 and 102 are able to be connected to form a device optimizing the distribution of the signal CLK by the tree 4. Here, this device is a buffer. These transistors 100 and 102 are, for example, identical to the transistors 60 and 62, except that the ground planes 72 and 80 are replaced by ground planes 108 and 110, respectively. Here, these ground planes 108 and 110 have the same doping type, of the identical type to the doping of the well 104.

The well 104 extends horizontally. This well 104 is located immediately below the ground planes 108 and 110 and, here, immediately above the well 35. This well 104 has the same doping type as the doping of the well 38. Here, this doping is therefore p-type. The doping concentration of the well 104 is, for example, substantially equal to the doping concentration of the well 38. This well 104 extends to the same depth as the wells 38 and 40, to within 10% or 5%. Thus, this well 104 lies in the plane of the wells 38 to 41.

The strip 106 is interposed between the well 104 and the wells 38 and 40 of the cells 42 contiguous with the cell 30. This strip 106 especially allows the well 104 to be separated and electrically isolated from the wells 38 and 39 of the immediately adjacent rows. For this purpose, this strip 106 has the opposite doping type to the doping of the well 104, so as to form a reverse bias p-n junction with the wells 104, 38 and 39.

This strip 106 has a width such that the smallest distance separating the wells 104 and 38 is larger than or equal to a threshold value $L_1$, as illustrated in FIG. 2 by the arrows 112 and 114. Here, this distance is measured in a horizontal direction. The threshold value especially depends on constraints imposed by design rules specific to the technology node of the fabrication process of the circuit 2. These rules especially require a threshold value be respected for the distance between two p-doped wells. In this example, for a 28 nm technology, the threshold value is greater than or equal to 1 µm or 500 nm or 100 nm.

Here, the strip 106 is an n-doped semiconductor layer with a doping concentration substantially equal to that of the well 104. This strip 106 extends parallel to the plane of the substrate 34 and uninterruptedly encircles the well 104. This strip 106 has the same depth as the well 104. This strip 106 is here contiguous, especially, with the well 40 and is able to be brought to the same electrical potential as the well 40.

Thus, the strip 106 makes it possible to electrically isolate the well 104, while ensuring the value $L_1$ required by the design rules is respected, without consuming too much of the surface space of the circuit 2. The clock tree cell 30, which occupies a smaller footprint, may therefore be placed much closer to the cells 42 while remaining protected from electrical interference due to these cells 42.

In this example, the network 50 is furthermore configured to make it possible to apply, to the well 104, an electrical bias that is different from the electrical bias applied to the wells 38 and/or 40.

Advantageously, the cell 30 comprises a connector 116 (FIG. 2) allowing the well 104 to be electrically biased. This connector 116 is, for example, identical to the connectors 46 and 48, and therefore is electrically connected directly to the well 104.

The ground planes 108 and 110 may thus be electrically biased by way of the well 104, and independently of the bias applied to the wells 38 and 40. This biasing of the ground planes 108 and 110 allows the electrostatic properties of the transistors 100 and 102 to be controlled. This control especially allows asymmetry between the electrical properties of the transistors 100 and 102 to be dynamically compensated.

Specifically, the transistors 100 and 102 of the cell 30 here form a CMOS (complementary metal-oxide-semiconductor) logic element. The transistors 100 and 102 here have a beta ratio chosen so that the rise time and fall time of the output clock signal transmitted by this cell 30 are substantially equal.

Modification of this beta ratio, creating what is called an asymmetry between the transistors of a given clock tree cell, may adversely affect the behaviour of the tree 4. This asymmetry may depend on uncontrollable and/or unpredictable parameters, such as the operating environment of the circuit 2 (temperature for example), or random variations in the fabrication process of the circuit 2.

Here, the cell 30 also comprises trench isolations 118 and 120. The trench isolations 118 and 120 have similar functions to those of the trench isolations 45 and 82, respectively, of the cell 42. The trench isolation 120 is, for example, identical to the trench isolation 82. The trench isolation 118 is produced in the same way as the trench isolation 45, but may have a larger width in the Y-direction. In this example, the trench isolation 118 forms only a single block of material with the trench isolation 45 of the cells 42, 43 that are immediately contiguous with this cell 30, on the sites where the cell 30 is contiguous with these cells 42, 43.

Advantageously, the cell 30 comprises passive electrical components such as an antenna diode 124 or a decoupling capacitor 126 (FIG. 2), which components are located above the layer 66 and plumb with the strip 106. These components may be electrically connected to other elements of the circuit 2 or of the cell 30.

Integrated circuits comprise such passive electrical components 124, 126. Here, that portion of the cell 30 which is located plumb with the well 106 has a large footprint on which it is undesirable to place a transistor. Thus, this surface space is used for the elements 124, 126. By placing the elements 124, 126 on this surface space it is possible to free up space in another zone of the circuit 2.

In this example, the diode 124 protects the cell 30 from antenna effects possibly occurring during fabrication steps of the circuit 2. For this purpose, the diode 124 is electrically connected between a portion of the interconnect network forming the tree 4, and a reference electrical potential, in order to limit the risk of electrical charge accumulated in this portion of the interconnect network during manufacture of this network degrading the electrical properties of the cell 30. This reference potential is, for example, the ground potential GND. In order to simplify FIG. 2, this connection is not shown. This diode 124 is, for example, a p-n diode formed above the layer 66.

Here, the capacitor 126 is electrically connected between either one of the transistors 100 and 102 and the reference electrical potential, in order to protect this transistor 100 or 102 from electrical disruption that could occur during operation of the circuit 2.

For example, the capacitor 126 comprises a metal-insulator-metal (MIM) capacitor formed in the "metallization" levels of the circuit 2 during steps of producing the electrical interconnects (interconnect layers) of the circuit 2.

Figure 5:
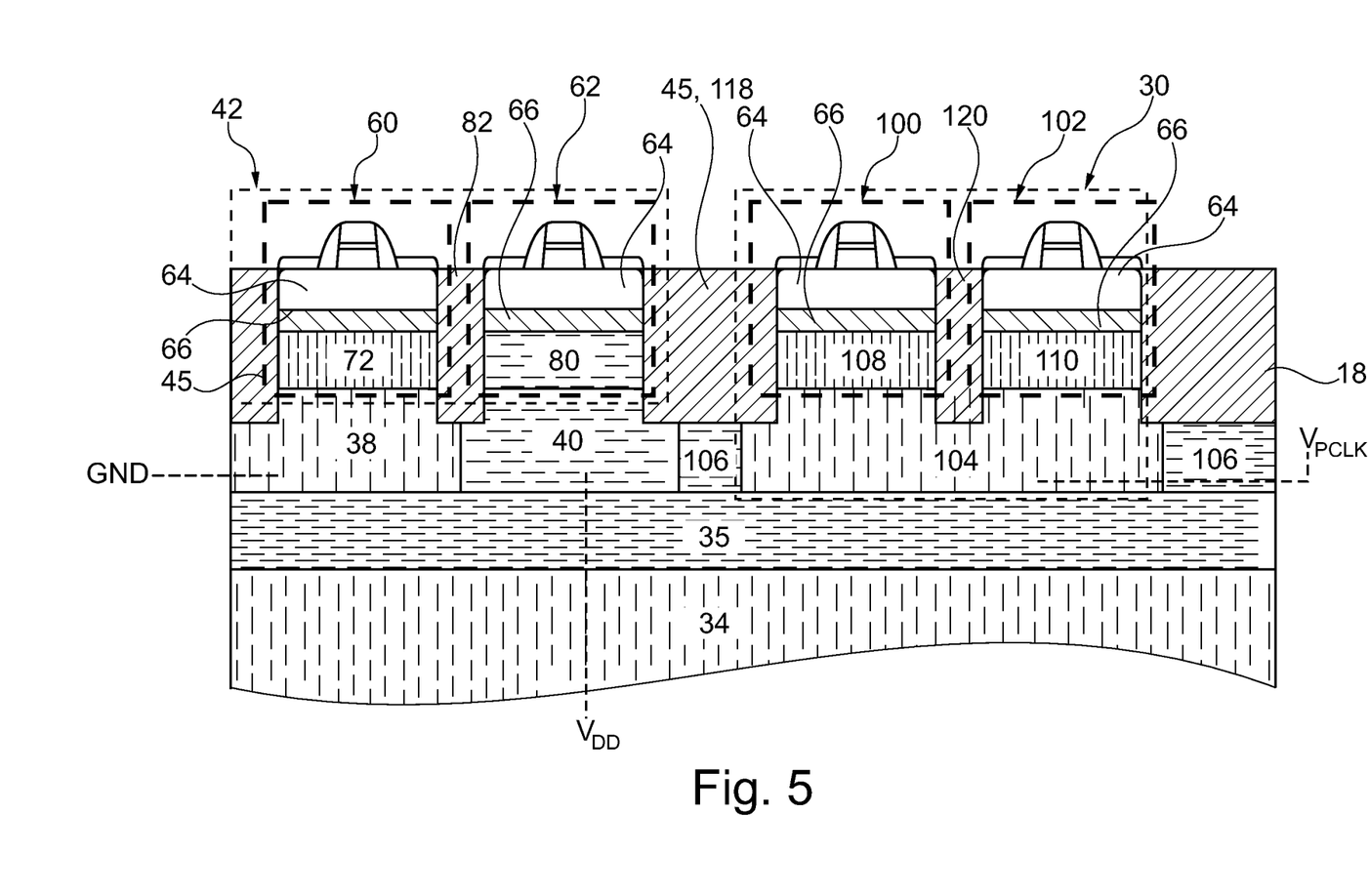
FIG. 5 is a schematic cross-sectional view of the cells in FIGS. 3 and 4, placed side-by-side.
Figure 6:
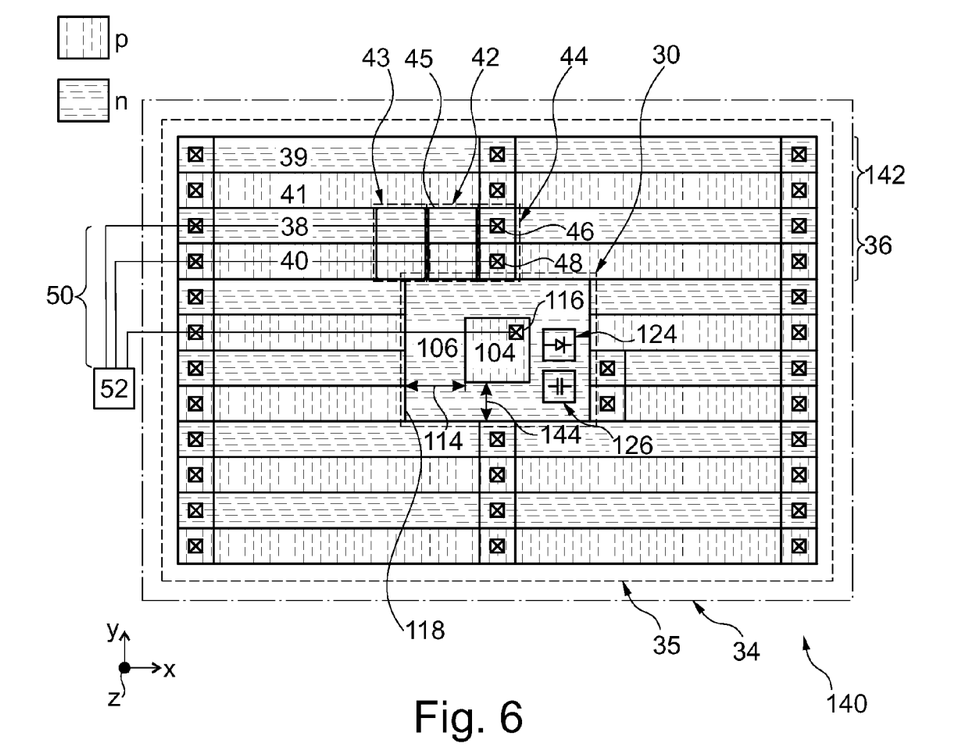
FIG. 6 is a schematic illustration of another embodiment of the block in FIG. 2.

FIG. 5 illustrates a block 140 able to be used instead of the block 6. This block is identical to the block 6, except that the rows are arranged in what is called a regular configuration (i.e. not a flipped row configuration). For this purpose, the row 37 is replaced by a row 142. This row 142 is, for example, identical to the row 37, except that the positions of the wells 39 and 41 are permutated.

With this arrangement of the wells, the well 104 and the strip 106 are dimensioned such as to respect the distance constraint imposed by the design rules, as illustrated by the arrow 144. For example, the distance constraint is the same as that of the block 6.

Figure 7:
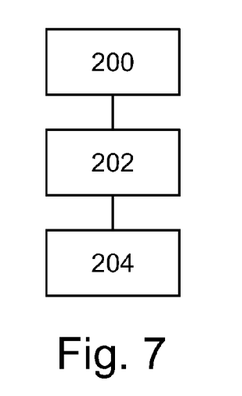
FIG. 7 is a flowchart of a method for using the integrated circuit in FIG. 1.

An example of the operation of the integrated circuit 2 will now be described with reference to the method in FIG. 7 and with the aid of FIGS. 2 and 3.

In a step 200, the circuit 2 is, for example, started up and supplied with power by an electrical voltage source.

In a step 202, biases $V_{PW}$ and $V_{NW}$ are applied to the wells 38 and 40, respectively.

Here, these biases $V_{PW}$ and $V_{NW}$ are applied by the network 50. Here, these biases $V_{PW}$ and $V_{NW}$ are equal to the ground potential GND and a supply voltage VDD of the circuit, respectively.

In a step 204, a bias $V_{PCLK}$ is applied to the well 104. This bias $V_{PCLK}$ is less than or equal to the smallest bias value $V_{NW}$ applied at the same time to the well 40, so as to limit the risk of forward biasing the p-n junction formed by contact between the well 104 and the strip 106 (the strip 106 being at the same electrical potential as the well 40). Here, the voltage $V_{PCLK}$ equals ground potential GND.

Many other embodiments are possible.

As a variant, the deep well 35 is omitted. In this case, the wells 38, 39, 40, 41 and 104 and the strip 106 make direct contact with the substrate 34. In order to limit the appearance of leakage currents between the wells 38, 39, 104, on the one hand, and 40, 41 and the strip 106, on the other hand, via the substrate 34, the biases $V_{PW}$ and $V_{NW}$ are adapted to prevent these wells 40, 41 and this strip 106 from forming, with the substrate 34, forward biased p-n junctions. To do this, the network 50 is configured so that the bias $V_{PW}$ equals ground potential GND.

The cell 30 may provide functions other than a buffer function. The cell 30 is, for example, adapted to control the propagation of the input clock signal using another control signal (gated clock).

The transistors 60, 62 of the block 6 could have another threshold voltage. For example these transistors could be HVT or LVT transistors. In this case, the biases $V_{PW}$ and $V_{NW}$ may have different values from those described.

As a variant, the source 74 and the drain 76 are not formed on the layer 64 but are formed inside this layer 64.

The circuit 2 illustrated in FIG. 1 may be different from the example illustrated and may especially comprise more logic and/or synchronous elements. The assembly 20 may have more than one input IN and/or more than one output OUT.

The cell 42 may comprise more than two transistors 60 and 62.

As a variant, the connector 46 of the well 38 is omitted in the case where the wells 38 and 39 have the same doping type and are contiguous, and the well 39 already comprises a connector that is identical to the connector 46. The same is also true for the connector 48 and the well 40.

The capacitor 126 may be formed in the semiconductor layer located above the layer 66, for example by means of a reverse biased p-n junction or a MOS transistor.

The source 52 may be omitted. In this case, the network 50 is electrically connected to an electrical power source located outside of the circuit 2.

The biases $V_{NW}$ and $V_{PW}$ may vary over time. These biases $V_{NW}$ and $V_{PW}$ may be modulated by a variable value $\Delta V$, for example in order to apply a reverse back bias (RBB) or a forward back bias (FBB). The same is true for the bias $V_{PCLK}$. These biases $V_{NW}$, $V_{PW}$ and $V_{PCLK}$ may be applied in a different order from that described.

The substrate 34 may be n-doped. In this case the well 35 is n-doped.

The elements 124 and 126 may be omitted.

The above description also applies to the case where the cells comprise non-FDSOI transistors and, in particular, transistors without the buried layer 66. Such transistors without a buried insulating layer between the layer 64 and the ground plane are said to be produced in "bulk" technology. In this case, each pMOS transistor is located on an n-doped well and ground plane. In contrast, each nMOS transistor is located on a p-doped well and ground plane. Thus, in the case of bulk technology, the transistors placed on the p-doped well 104 are both nMOS transistors. If necessary, the one or more pMOS transistors of the clock tree cell are then placed in the n-doped strip 106. To do this, for example, the strip 106 is modified to extend not only around the well 104 but also around the ground plane of the nMOS transistors.

The invention claimed is:

1. Integrated circuit, comprising:
   a semiconductor substrate lying essentially in a plane called the substrate plane;
   a block located on the substrate comprising:
      at least first and second oppositely doped semiconductor wells, placed beside each other in a given well plane parallel to the substrate plane;
      contiguous standard cells, each standard cell comprising first field-effect transistors in FDSOI technology, each first transistor comprising a first semiconductor ground plane located only above a single of the first or second wells, in order to be electrically biased by way of the well above which it is located; and
      a clock tree cell encircled by standard cells, so that the clock tree cell is contiguous with standard cells, the clock tree cell comprising:
   a third semiconductor well, lying in the well plane, the third well having the same doping type as the doping of the first well;
   second field-effect transistors in FDSOI technology, each second transistor comprising a second semiconductor ground plane, each ground plane of each second transistor of the clock tree cell being located above the third well, in order to be electrically biased by way of this third well; and
   a semiconductor strip extending continuously around the third well, in the well plane, the semiconductor strip having the opposite doping type to the doping of the third well, so as to electrically isolate the third well from the first well.

2. Integrated circuit according to claim 1, in which:
   each first well has the same doping type as the doping of the substrate; and
   the block furthermore comprises a deep buried well, extending continuously, in a plane parallel to the substrate plane located under the well plane, under each first well of the block and under the third well, the deep buried well having the opposite doping type to that of the substrate in order to electrically isolate from the substrate each first well and the third well.

3. Integrated circuit according to claim 1, in which the circuit comprises an electrical interconnect network, the network comprising electrical connections able to:
   transmit, only to clock tree cells of a given clock tree, at least one input clock signal, from which each clock tree cell is able to generate at least one output clock signal; and
   transmit the output clock signal of the clock tree cell to standard cells or other clock cells located in the same block.

4. Integrated circuit according to claim 1, in which the circuit comprises an electrical power supply network, the power supply network comprising first and second electrical connections that are electrically isolated from each other, the first electrical connection allowing a first electrical bias to be applied to the first well and the second connection allowing a second electrical bias to be applied to the third well.

5. Integrated circuit according to claim 1, in which the block comprises, for each of the first and second wells, at least one first connector per well making direct electrical contact with this well, this first connector being able to be electrically connected to an external voltage source.

6. Integrated circuit according to claim 1, in which the clock tree cell comprises at least one connector making direct electrical contact with the third well, this connector being able to electrically bias this third well with an electrical bias delivered by an external voltage source.

7. Integrated circuit according to claim 1, in which the clock tree cell comprises an antenna diode electrically connected directly between a portion of an interconnect network and an electrical reference potential and able to protect electrically the clock tree cell from antenna effects that could be encountered in steps for fabricating the circuit, this diode being, for this purpose, located above the semiconductor strip, in a direction perpendicular to the substrate plane and on the side opposite the substrate.

8. Integrated circuit according to claim 1, in which the clock tree cell comprises a decoupling capacitor able to protect electrically an electrical power supply network from electrical interference, this decoupling capacitor being, for this purpose, electrically connected directly between an electrical power supply network and an electrical reference potential, the decoupling capacitor being located above the semiconductor strip, in a direction perpendicular to the plane of the substrate and on the side opposite the substrate.

9. Integrated circuit according to claim 1, in which the smallest distance separating the third well and a first well is 100 nm or more.

10. Integrated circuit according to claim 1, in which:
    the clock tree cell comprises a first trench isolation, made of an electrically insulating material, encircling each ground plane of each transistor of the clock tree cell, in order to separate the ground plane of each transistor of the clock tree cell from the ground planes of the transistors of contiguous standard cells; and
    each standard cell comprises a second trench isolation made of an electrically insulating material, encircling each ground plane of each transistor of the standard cell, in order to separate the ground plane of each transistor of this standard cell from the ground planes of the transistors of contiguous standard cells, a portion of this second trench isolation being common to the first trench isolation if this standard cell is immediately contiguous with the clock tree cell.

11. Integrated circuit according to claim 1, in which the cells of the block are arranged in rows of cells parallel to and contiguous with one another, each row only comprising one example of the first and second well, these first and second wells of a given row extending, in the well plane, parallel to the row.

12. Method for using an integrated circuit, comprising the following steps:
   providing an integrated circuit according to claim 1;
   applying first and second electrical biases to the first and second wells of the circuit, respectively; and
   applying a third electrical bias to the third well of the circuit, this third bias being chosen depending on the first and second biases applied, at the same time, to the first and second wells, so that the p-n junction formed by the third well and the semiconductor strip is reverse biased.

* * * * *